United States Patent
Parthasarathy et al.

(10) Patent No.: US 11,562,793 B2
(45) Date of Patent: Jan. 24, 2023

(54) READ SOFT BITS THROUGH BOOSTED MODULATION FOLLOWING READING HARD BITS

(71) Applicant: Micron Technology, Inc., Boise, ID (US)

(72) Inventors: Sivagnanam Parthasarathy, Carlsbad, CA (US); James Fitzpatrick, Laguna Niguel, CA (US); Patrick Robert Khayat, San Diego, CA (US); AbdelHakim S. Alhussien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 16/869,492

(22) Filed: May 7, 2020

(65) Prior Publication Data
US 2021/0350857 A1 Nov. 11, 2021

(51) Int. Cl.
*G11C 16/26* (2006.01)
*G06F 11/07* (2006.01)
*G11C 16/04* (2006.01)

(52) U.S. Cl.
CPC ............ *G11C 16/26* (2013.01); *G06F 11/076* (2013.01); *G06F 11/0727* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 5,864,504 A | * | 1/1999 | Tanzawa ............. G11C 11/5642 365/185.24 |
| 7,117,231 B2 | | 10/2006 | Fischer et al. |
| 9,129,698 B2 | | 9/2015 | Zeng et al. |
| 9,385,896 B1 | | 7/2016 | Mitra et al. |
| 10,008,273 B2 | | 6/2018 | Ray et al. |
| 10,347,344 B2 | | 7/2019 | Malshe et al. |
| 11,029,890 B1 | | 6/2021 | Parthasarathy et al. |
| 11,081,200 B1 | | 8/2021 | Parthasarathy et al. |

(Continued)

OTHER PUBLICATIONS

"Xie et al","Polar codes for NAND-based SSD systems—A joint source channel coding perspective",(2017)—IEEE (Year: 2017).*

(Continued)

*Primary Examiner* — April Y Blair
*Assistant Examiner* — Matthew W Wahlin
(74) *Attorney, Agent, or Firm* — Greenberg Traurig

(57) ABSTRACT

A memory sub-system configured to read soft bit data by adjusting the read voltage applied to read hard bit data from memory cells. For example, in response to a read command identifying a group of memory cells, a memory device is to: read the group of memory cells using a first voltage to generate hard bit data indicating statuses of the memory cells subjected to the first voltage; change (e.g., through boosted modulation) the first voltage, currently being applied to the group of memory cells, to a second voltage and then to a third voltage; reading the group of memory cells at the second voltage and at the third voltage to generate soft bit data (e.g., via an exclusive or (XOR) of the results of reading the group of memory cells at the second voltage and at the third voltage).

18 Claims, 6 Drawing Sheets

(56) References Cited

U.S. PATENT DOCUMENTS

| | | | |
|---|---|---|---|
| 11,086,572 B1 | 8/2021 | Alhussien et al. | |
| 11,221,800 B2 | 1/2022 | Fitzpatrick et al. | |
| 11,237,726 B2 | 2/2022 | Fitzpatrick et al. | |
| 11,257,546 B2 | 2/2022 | Fitzpatrick et al. | |
| 11,264,103 B2 | 3/2022 | Papandreou et al. | |
| 11,341,410 B1 | 5/2022 | Johnson et al. | |
| 2006/0166675 A1 | 7/2006 | Yoon | |
| 2008/0002468 A1 | 1/2008 | Hemink | |
| 2008/0056008 A1 | 3/2008 | Aritome et al. | |
| 2008/0192544 A1 | 8/2008 | Berman et al. | |
| 2010/0027337 A1 | 2/2010 | Park | |
| 2011/0066915 A1 | 3/2011 | Arye | |
| 2011/0221514 A1* | 9/2011 | Pan | H02M 3/07 327/536 |
| 2011/0280084 A1* | 11/2011 | Radke | G11C 16/26 365/185.21 |
| 2012/0198129 A1 | 8/2012 | Van Aken et al. | |
| 2012/0246395 A1 | 9/2012 | Cho et al. | |
| 2013/0007343 A1 | 1/2013 | Rub et al. | |
| 2013/0070524 A1 | 3/2013 | Dutta et al. | |
| 2013/0151753 A1* | 6/2013 | Jeon | G11C 11/5642 711/E12.008 |
| 2014/0022853 A1 | 1/2014 | Choi et al. | |
| 2014/0068384 A1 | 3/2014 | Kwak et al. | |
| 2014/0071761 A1* | 3/2014 | Sharon | G11C 11/5642 365/185.18 |
| 2015/0124533 A1 | 5/2015 | Zeng et al. | |
| 2015/0171957 A1 | 6/2015 | Featherston et al. | |
| 2016/0094247 A1 | 3/2016 | Parthasarathy et al. | |
| 2016/0187961 A1 | 6/2016 | Elibol et al. | |
| 2016/0300609 A1 | 10/2016 | Han et al. | |
| 2018/0144786 A1 | 5/2018 | Lim et al. | |
| 2018/0253353 A1 | 9/2018 | Takase | |
| 2019/0043590 A1 | 2/2019 | Besinga et al. | |
| 2019/0130967 A1 | 5/2019 | Danjean et al. | |
| 2019/0130982 A1* | 5/2019 | Reusswig | G11C 29/52 |
| 2019/0318791 A1 | 10/2019 | Lin et al. | |
| 2019/0362783 A1 | 11/2019 | Tokutomi et al. | |
| 2019/0379404 A1 | 12/2019 | Blankenship et al. | |
| 2020/0021358 A1 | 1/2020 | Maccaglia et al. | |
| 2020/0118620 A1* | 4/2020 | Bazarsky | G11C 29/42 |
| 2020/0125097 A1 | 4/2020 | Juliato et al. | |
| 2020/0201608 A1 | 6/2020 | Wallbaum et al. | |
| 2020/0293398 A1 | 9/2020 | Symons et al. | |
| 2020/0302318 A1 | 9/2020 | Hetherington et al. | |
| 2021/0152191 A1 | 5/2021 | Sarkis et al. | |
| 2021/0181942 A1 | 6/2021 | Fitzpatrick et al. | |
| 2021/0182166 A1 | 6/2021 | Hahn et al. | |
| 2021/0271415 A1 | 9/2021 | Fitzpatrick et al. | |
| 2021/0271416 A1 | 9/2021 | Alhussien et al. | |
| 2021/0271422 A1 | 9/2021 | Parthasarathy et al. | |
| 2021/0271549 A1 | 9/2021 | Khayat et al. | |
| 2021/0273650 A1 | 9/2021 | Parthasarathy et al. | |
| 2021/0311668 A1 | 10/2021 | Alhussien et al. | |
| 2021/0350856 A1 | 11/2021 | Fitzpatrick et al. | |
| 2021/0350869 A1 | 11/2021 | Parthasarathy et al. | |
| 2022/0083277 A1 | 3/2022 | Fitzpatrick et al. | |
| 2022/0107731 A1 | 4/2022 | Fitzpatrick et al. | |
| 2022/0139468 A1 | 5/2022 | Fitzpatrick et al. | |

OTHER PUBLICATIONS

Memory System Performance Enhancements using Measured Signal and Noise Characteristics of Memory Cells, U.S. Appl. No. 16/714,463, filed Dec. 13, 2019, James Fitzpatrick et al., Notice of Allowance Mailed—Application Received in Office of Publications, Jun. 2, 2021.
Memory System Performance Enhancements using Measured Signal and Noise Characteristics of Memory Cells, U.S. Appl. No. 17/552,179, filed Dec. 15, 2021, James Fitzpatrick et al., Application Undergoing Preexam Processing, Dec. 15, 2021.
Improved Reading of Soft Bits and Hard Bits From Memory Cells, U.S. Appl. No. 16/869,488, filed May 7, 2020, James Fitzpatrick et al., Notice of Allowance Mailed—Application Received in Office of Publications, Jul. 7, 2021.
Adaptive and/or Iterative Operations in Executing a Read Command to Retrieve Data From Memory Cells, U.S. Appl. No. 16/807,059, filed Mar. 2, 2020, James Fitzpatrick et al., Notice of Allowance Mailed—Application Received in Office of Publications, Apr. 26, 2021.
Adaptive and/or Iterative Operations in Executing a Read Command to Retrieve Data from Memory Cells, U.S. Appl. No. 17/534,850, filed Nov. 24, 2021, James Fitzpatrick et al., Application Undergoing Preexam Processing, Nov. 24, 2021.
Self Adapting Iterative Read Calibration to Retrieve Data from Memory Cells, U.S. Appl. No. 17/350,425, filed Jun. 17, 2021, Abdelhakim Alhussien et al., Docketed New Case—Ready for Examination, Aug. 24, 2021.
Compound Feature Generation in Classification of Error Rate of Data Retrieved from Memory Cells, U.S. Appl. No. 17/313,944, filed May 6, 2021, Sivagnanam Parthasarathy et al., Docketed New Case—Ready for Examination, Aug. 23, 2021.
Memory System Performance Enhancements using Measured Signal and Noise Characteristics of Memory Cells, U.S. Appl. No. 16/714,463, filed Dec. 13, 2019, James Fitzpatrick et al., Final Rejection Mailed, Jun. 2, 2021.
Improved Reading of Soft Bits and Hard Bits From Memory Cells, U.S. Appl. No. 16/869,488, filed May 7, 2020, James Fitzpatrick et al., Docketed New Case—Ready for Examination, May 29, 2020.
Intelligent Proactive Responses to Operations to Read Data From Memory Cells, U.S. Appl. No. 16/869,494, filed May 7, 2020, Sivagnanam Parthasarathy et al., Awaiting TC Resp, Issue Fee Payment Verified, Jun. 17, 2021.
Intelligent Proactive Responses to Operations to Read Data from Memory Cells, U.S. Appl. No. 17/346,125, filed Jun. 11, 2021, Sivagnanam Parthasarathy et al., Application Undergoing Preexam Processing, Jun. 11, 2021.
Adaptive and/or Iterative Operations in Executing a Read Command to Retrieve Data From Memory Cells, U.S. Appl. No. 16/807,059, filed Mar. 2, 2020, James Fitzpatrick et al., Non Final Action Mailed, Apr. 26, 2021.
Self Adapting Iterative Read Calibration to Retrieve Data From Memory Cells, U.S. Appl. No. 16/807,061, filed Mar. 2, 2020, Abdelhakim Alhussien et al., Notice of Allowance Mailed—Application Received in Office of Publications, Nov. 13, 2020.
Self Adapting Iterative Read Calibration to Retrieve Data from Memory Cells, U.S. Appl. No. 17/350,425, filed Jun. 17, 2021, Abdelhakim Alhussien et al., Application Undergoing Preexam Processing, Jun. 17, 2021.
Compound Feature Generation in Classification of Error Rate of Data Retrieved From Memory Cells, U.S. Appl. No. 16/807,063, filed Mar. 2, 2020, Sivagnanam Parthasarathy et al., Publications—Issue Fee Payment Verified, May 3, 2021.
Compound Feature Generation in Classification of Error Rate of Data Retrieved from Memory Cells, U.S. Appl. No. 17/313,944, filed May 6, 2021, Sivagnanam Parthasarathy et al., Application Undergoing Preexam Processing, May 6, 2021.
International Search Report and Written Opinion, PCT/US2020/063788, dated Mar. 26, 2021.
Memory System Performance Enhancements using Measured Signal and Noise Characteristics of Memory Cells, U.S. Appl. No. 16/714,463, filed Dec. 13, 2019, James Fitzpatrick et al., Docketed New Case—Ready for Examination, Jan. 30, 2020.
Improved Reading of Soft Bits and Hard Bits From Memory Cells, U.S. Appl. No. 16/869,488, James Fitzpatrick et al., Application Undergoing Preexam Processing, May 7, 2020.
Intelligent Proactive Responses to Operations to Read Data From Memory Cells, U.S. Appl. No. 16/869,494, Sivagnanam Parthasarathy et al., Application Undergoing Preexam Processing, May 7, 2020.
Adaptive and/or Iterative Operations in Executing a Read Command to Retrieve Data From Memory Cells, U.S. Appl. No. 16/807,059, filed Mar. 2, 2020, James Fitzpatrick et al., Docketed New Case—Ready for Examination, Mar. 31, 2020.

(56) References Cited

OTHER PUBLICATIONS

Self Adapting Iterative Read Calibration to Retrieve Data From Memory Cells, U.S. Appl. No. 16/807,061, filed Mar. 2, 2020, Abdelhakim Alhussien et al., Docketed New Case—Ready for Examination, Mar. 31, 2020.
Compound Feature Generation in Classification of Error Rate of Data Retrieved From Memory Cells, U.S. Appl. No. 16/807,063, filed Mar. 2, 2020, Sivagnanam Parthasarathy et al., Docketed New Case—Ready for Examination, Mar. 31, 2020.
Memory System Performance Enhancements using Measured Signal and Noise Characteristics of Memory Cells, U.S. Appl. No. 16/714,463, filed Dec. 13, 2019, James Fitzpatrick et al., Patented Case, Jun. 2, 2021.
Memory System Performance Enhancements using Measured Signal and Noise Characteristics of Memory Cells, U.S. Appl. No. 17/552,179, filed Dec. 15, 2021, James Fitzpatrick et al., Docketed New Case—Ready for Examination, Dec. 29, 2021.
Dynamic Adjustment of Data Integrity Operations of a Memory System Based on Error Rate Classification, U.S. Appl. No. 16/807,056, filed Mar. 2, 2020, Patrick Khayat et al., Docketed New Case—Ready for Examination, Apr. 14, 2020.
Improved Reading of Soft Bits and Hard Bits From Memory Cells, U.S. Appl. No. 16/869,488, filed May 7, 2020, James Fitzpatrick et al., Patented Case, Jul. 7, 2021.
Improved Reading of Soft Bits and Hard Bits from Memory Cells, U.S. Appl. No. 17/577,716, filed Jan. 18, 2022, James Fitzpatrick et al., Docketed New Case—Ready for Examination, Jan. 26, 2022.
Intelligent Proactive Responses to Operations to Read Data From Memory Cells, U.S. Appl. No. 16/869,494, filed May 7, 2020, Sivagnanam Parthasarathy et al., Patented Case, Jul. 14, 2021.
Intelligent Proactive Responses to Operations to Read Data from Memory Cells, U.S. Appl. No. 17/346,125, filed Jun. 11, 2021, Sivagnanam Parthasarathy et al., Docketed New Case—Ready for Examination, Aug. 23, 2021.
Adaptive and/or Iterative Operations in Executing a Read Command to Retrieve Data From Memory Cells, U.S. Appl. No. 16/807,059, filed Mar. 2, 2020, James Fitzpatrick et al., Patented Case, Apr. 26, 2021.
Adaptive and/or Iterative Operations in Executing a Read Command to Retrieve Data From Memory Cells, U.S. Appl. No. 17/534,850, filed Nov. 24, 2021, James Fitzpatrick et al., Docketed New Case—Ready for Examination, Dec. 8, 2021.
Self Adapting Iterative Read Calibration to Retrieve Data From Memory Cells, U.S. Appl. No. 16/807,061, filed Mar. 2, 2020, Abdelhakim Alhussien et al., Patented Case, Nov. 13, 2020.
Self Adapting Iterative Read Calibration to Retrieve Data from Memory Cells, U.S. Appl. No. 17/350,425, filed Jun. 17, 2021, Abdelhakim Alhussien et al., Publications—Issue Fee Payment Verified, Jun. 21, 2022.
Self Adapting Iterative Read Calibration to Retrieve Data from Memory Cells, U.S. Appl. No. 17/848,292, filed Jun. 23, 2022, Abdelhakim Alhussien et al., Application Undergoing Preexam Processing, Jun. 23, 2022.
Compound Feature Generation in Classification of Error Rate of Data Retrieved From Memory Cells, U.S. Appl. No. 16/807,063, filed Mar. 2, 2020, Sivagnanam Parthasarathy et al., Patented Case, May 19, 2021.
Compound Feature Generation in Classification of Error Rate of Data Retrieved from Memory Cells, U.S. Appl. No. 17/313,944, filed May 6, 2021, Sivagnanam Parthasarathy et al., Notice of Allowance Mailed—Application Received in Office of Publications, Jun. 7, 2022.
Classification of Error Rate of Data Retrieved From Memory Cells, U.S. Appl. No. 16/807,065, filed Mar. 2, 2020, Sivagnanam Parthasarathy et al., Docketed New Case—Ready for Examination, Mar. 30, 2020.

* cited by examiner ated encoded data for storing in the memory sub-system.
READ SOFT BITS THROUGH BOOSTED MODULATION FOLLOWING READING HARD BITS

FIELD OF THE TECHNOLOGY

At least some embodiments disclosed herein relate to memory systems in general, and more particularly, but not limited to memory systems configured to read soft bit data through boosted modulation of voltages for reading hard bit data from memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
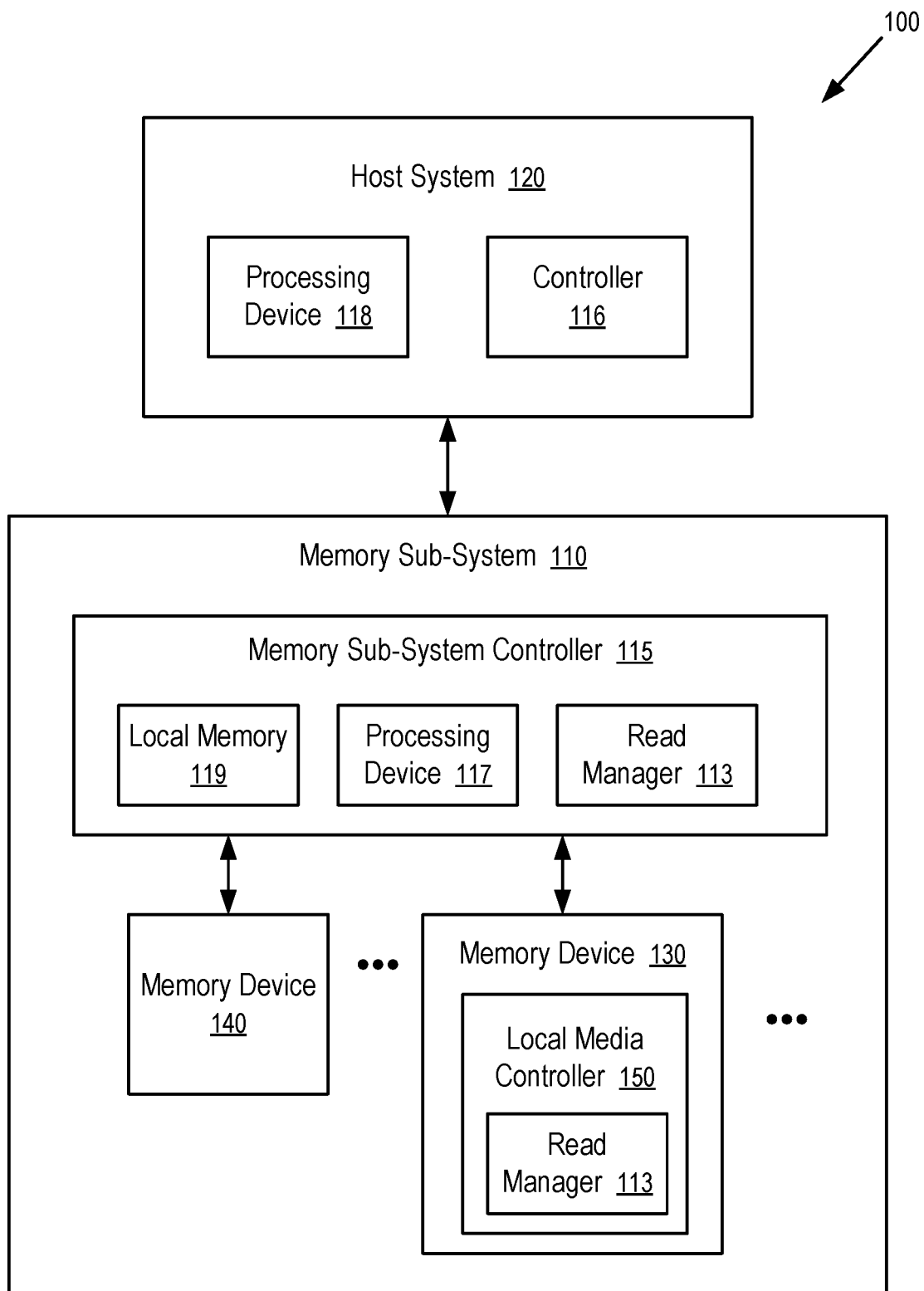
FIG. 1 illustrates an example computing system having a memory sub-system in accordance with some embodiments of the present disclosure.

At least some aspects of the present disclosure are directed to a memory sub-system configured to read soft bit data by boost modulating voltages applied to read hard bit data from memory cells. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in raw, encoded data retrieved from the memory sub-system and/or recover the original, non-encoded data that is used to generated encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

When the encoded data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by reading soft bit data following the reading of hard bit data. For example, the read voltage applied to obtain hard bit data from memory cells can be changed (e.g., through boosted modulation) to voltages adjacent to the read voltage to further read the memory cells and thus obtain soft bit data. The soft bit data can be used in a decoder to decode the hard bit data when the hard bit data contains too many errors for decoding without the soft bit data. The use of the soft bit data improves the error recovery capability of the decoder.

For example, immediately after the memory cells are read via applying the read voltage to the memory cells, the read voltage can be adjusted to adjacent voltages to further read the memory cells to determine the exclusive or (XOR) of the results retrieved at the adjacent voltages. The XOR results indicate whether the states read from the memory cells at the adjacent voltages agree with each other.

For example, one adjacent voltage can be 50 mV lower than the read voltage; and the other adjacent voltage can be 50 mV higher than the read voltage. Thus, the XOR results in the soft bit data indicate whether the memory cells provide the same or different results when the read voltage shifts up or down by 50 mV.

Similarly, a further set of adjacent voltages can be 90 mV from the read voltage; and the corresponding XOR results for the soft bit data indicate whether the memory cells provide the same or different results when the read voltage shifts up or down by 90 mV.

In contrast, the hard bit data corresponds to the states of the memory cells at the read voltage (e.g., whether the memory cells are conductive at the read voltage).

Changing the read voltage to adjacent voltages through boosted modulation can reduce the time for reading the soft bit data. For example, if the soft bit data is read in response to a separate command, the read process of the soft bit data can take a longer time period. For example, if the soft bit data is requested following a decoding operation in which hard bit data fails to decode without soft bit data in available decoders in the memory, the memory device may have to perform operations to set up the circuit for selecting the memory cells for reading again, and to ramp up the voltage on the selected memory cells to the vicinity of the read voltage in order to read the soft bit data. The delay can be longer when some of the resources in the memory device are used for executing a separate command. However, if the soft bit data is read immediately following the reading of the hard bit data, the additional time for reading the soft bit data can be reduced and/or minimized.

Optionally, in response to the read command, the memory device calibrates the read voltage(s) based on signal and noise characteristics measured for memory cells, read memory cells to obtain hard bit data using the calibrated read voltage(s), and boost modulating the applied read voltage(s) to adjacent voltages to read memory cells for soft bit data.

Preferably, the operations of reading the hard bit data and reading the soft bit data are scheduled together during the execution of the read command to minimize the time required to obtain the soft bit data and/or to avoid delay that can be caused by processing a separate read command, or by intervening operations on the memory cells.

Optionally, the signal and noise characteristics measured for memory cells are used to evaluate the quality of the hard bit data retrieved using the calibrated read voltage(s). The evaluation can be performed at least in part concurrently with the reading of the hard bit data. Based on the evaluated quality of the hard bit data, the memory device may selectively read the soft bit data through boosted modulations of the applied voltages for reading the hard bit data.

The hard bit data retrieved from a group of memory cells using the calibrated/optimized read voltage can be decoded using an error detection and data recovery technique, such as Error Correction Code (ECC), Low-Density Parity-Check (LDPC) code, etc. When the error rate in the hard bit data is high, the soft bit data, retrieved from the memory cell using read voltages with predetermined offsets from the calibrated/optimized read voltage, can be used to assist the decoding of the hard bit data. When the soft bit data is used, the error recovery capability is improved in decoding the hard bit data.

Optionally, a controller of a memory sub-system can initially send a command to a memory device to read hard bit data with calibrated read voltage; and in response to a failure in the decoding of the hard bit data, the controller can further send a command to the memory device to read the corresponding soft bit data. Such an implementation is efficient when the likelihood of a failure in decoding the hard bit data without soft bit data is lower than a threshold. However, when the likelihood is above the threshold, the overhead of sending the separate command becomes disadvantageous.

When the likelihood of using soft bit data is above a threshold, it is advantageous to transmit a single command to the memory device to cause the memory device to read the soft bit data and the hard bit data together. Further, the memory device can use the signal and noise characteristics of the memory cells to predict whether the soft bit data is likely to be used by the controller. If the likelihood of using of the soft bit data is lower than a threshold, the memory device can skip reading the soft bit data.

For example, during the calibration operation, the memory device can measure the signal and noise characteristics of the memory cells and use the measurements to calculate an optimized/calibrated read voltage for reading the memory cells. Once the optimized/calibrated read voltage is obtained, the memory device reads the memory cells to obtain the hard bit data. Subsequently, the memory device adjusts the already applied optimized/calibrated read voltage (e.g., through boosted modulation) to a predetermined offset (e.g., 50 mV) below the optimized/calibrated read voltage to retrieve a set of data, and further adjusts the currently applied voltage (e.g., through boosted modulation) to the predetermined offset above the optimized/calibrated read voltage to retrieve another set of data. The logic operation of XOR (exclusive or) of the two sets of data at the both sides of the offset (e.g., 50 mV) from the optimized/calibrated read voltage provides the indication of whether the memory cells provide the same reading at the offset locations around the optimized/calibrated read voltage. The result of the XOR operation can be used as soft bit data for decoding the hard bit data read using the optimized/calibrated read voltage. In some implementations, a larger offset (e.g., 90 mV) can be used to read another set of soft bit data that indicates whether the memory cells provide the same reading at the locations according to the larger offset (e.g., 90 mV) around the optimized/calibrated read voltage.

For example, in response to a read command from a controller of the memory sub-system, a memory device of the memory sub-system performs an operation to calibrate a read voltage of memory cells. The calibration is performed by measuring signal and noise characteristics through reading the memory cells at a number of voltage levels that are near an estimated location of the optimized read voltage. An optimized read voltage can be calculated based on statistical data of the results generated from reading the memory cells at the voltage levels. For example, the statistical data can include and/or can be based on counts measured by calibration circuitry at the voltage levels. Optionally, such signal and noise characteristics can be measured for sub-regions in parallel to reduce the total time for measuring the signal and noise characteristics. The statistical data of the results generated from reading the memory cells at the voltage levels can be used to predict whether the decoding of the hard bit data retrieved using the optimized read voltage is likely to require the use of soft bit data for successful decoding. Thus, the transmission of the soft bit data can be performed selectively based on the prediction.

For example, a predictive model can be generated through machine learning to estimate or evaluate the quality of data that can be retrieved from a set of memory cells using the calibrated/optimized read voltage(s). The predictive model can use features calculated from the measured signal and noise characteristics of the memory cells as input to generate a prediction. The reading and/or transmission of the soft bit data can be selectively skipped based on the prediction.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell.

In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read manager 113 configured to implement a read command that instructs to the memory device to reading soft bits by adjusting the voltages applied to read hard bits from memory cells. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

For example, the read manager 113 implemented in the controller 115 can transmit a particular read command that is configured to request the memory device 130 to read soft bit data by boost modulation of voltages applied to read hard bit data. In response to such a read command, the read manager 113 implemented in the memory device 130 is configured to read the hard bit data by applying the optimized read voltage (e.g., received from the controller 115, determined for the measured signal and noise characteristics, or determined in another way), and read the soft bit data by applying read voltages that are centered at the optimized read voltage with a predetermined offset.

Optionally, in response to such a read command, the read manager 113 implemented in the memory device 130 is further configured to measure signal and noise characteristics, and determine an optimized read voltage from the measured signal and noise characteristics to read the hard bit data.

Optionally, the read manager 113 is further configured to classify the error rate in the hard bit data using the measured signal and noise characteristics and selectively determine whether to read the soft bit data and/or whether to transmit the soft bit data to the controller 115 as a response to the read command. The read manager 113 can optionally accept a response from the memory device 130 that does not include the soft bit data.

Figure 2:
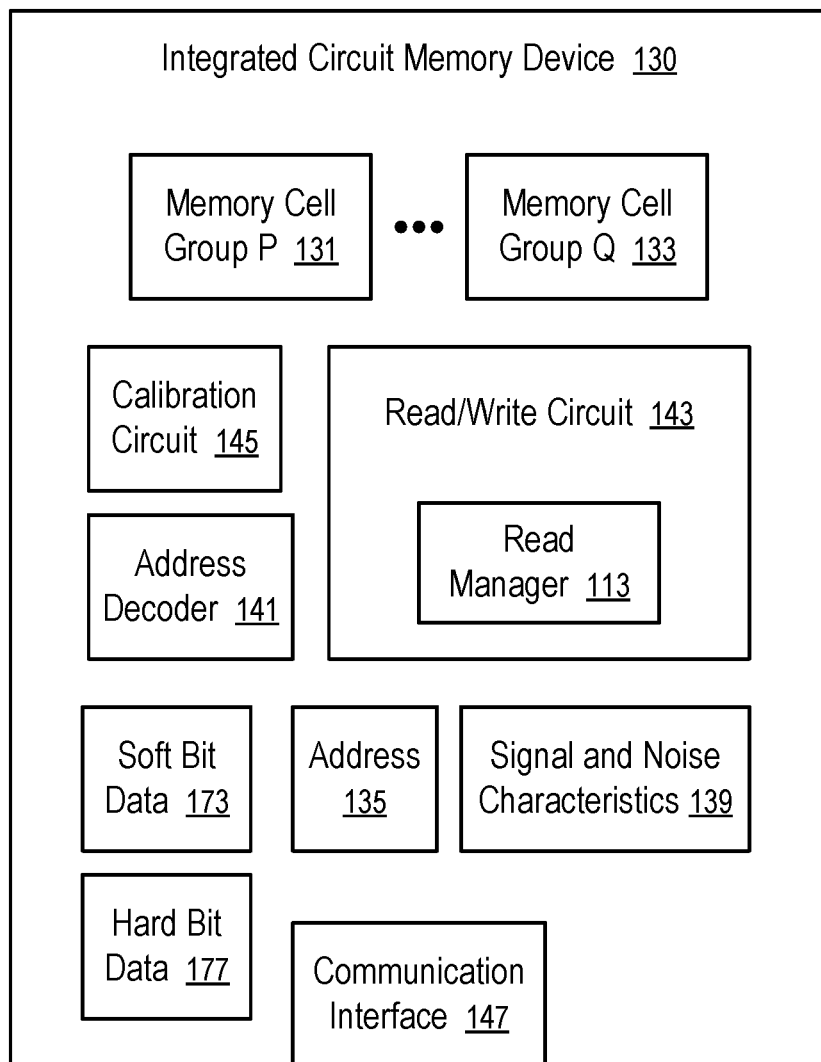
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve both hard bit data 177 and soft bit data 173 from the memory address 135, and provide at least the hard bit data 177 as a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the hard bit data 177 and the soft bit data 173 of memory cells at the address 135.

The integrated circuit memory device 130 has a calibration circuit 145 configured to determine measurements of signal and noise characteristics 139 of memory cells in a group (e.g., 131, . . . , or 133). For example, the statistics of memory cells in a group or region that has a particular state at one or more test voltages can be measured to determine the signal and noise characteristics 139. Optionally, the signal and noise characteristics 139 can be provided by the memory device 130 to the controller 115 of a memory sub-system 110 via the communication interface 147.

In at least some embodiments, the calibration circuit 145 determines the optimized read voltage(s) of the group of memory cells based on the signal and noise characteristics 139. In some embodiments, the signal and noise characteristics 139 are further used in the calibration circuit 145 to determine whether the error rate in the hard bit data 177 is sufficiently high such that it is preferred to decode the hard bit data 177 in combination with the soft bit data 173 using a sophisticated decoder. When the use of the soft bit data 173 is predicted, based on the prediction/classification of the error rate in the hard bit data 177, the read manager 113 can transmit both the soft bit data 173 and the hard bit data 177 to the controller 115 of the memory sub-system 110.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the hard bit data 177 and the soft bit data 173 from the address 135. Since the signal and noise characteristics 139 is measured as part of the operation to read the hard bit data 177 from the address 135, the signal and noise characteristics 139 can be used in the read manager 113 with reduced or no penalty on the latency in the execution of the command to read the hard bit data 177 from the address 135.

The read manager 113 of the memory device 130 is configured to use the signal and noise characteristics 139 to determine the voltages used to read memory cells identified by the address 135 for both hard bit data and soft bit data and to determine whether to transmit the soft bit data to the memory sub-system controller 113.

For example, the read manager 113 can use a predictive model, trained via machine learning, to predict the likelihood of the hard bit data 177 retrieved from a group of memory cells (e.g., 131 or 133) failing a test of data integrity. The prediction can be made based on the signal and noise characteristics 139. Before the test is made using error-correcting code (ECC) and/or low-density parity-check (LDPC) code, or even before the hard bit data 177 is transferred to a decoder, the read manager 113 uses the signal and noise characteristics 139 to predict the result of the test. Based on the predicted result of the test, the read manager 113 determines whether to transmit the soft bit data to the memory sub-system controller 113 in a response to the command.

For example, if the hard bit data 177 is predicted to decode using a low-power decoder that uses hard bit data 177 without using the soft bit data 173, the read manager 113 can skip the transmission of the soft bit data 173 to the memory sub-system controller 115; and the read manager 113 provides the hard bit data 177, read from the memory cells using optimized read voltages calculated from the signal and noise characteristics 139, for decoding by the low-power decoder. For example, the low-power decoder can be implemented in the memory sub-system controller 115. Alternatively, the low-power decoder can be implemented in the memory device 130; and the read manager 113 can provide the result of the lower-power decoder to the memory sub-system controller 115 as the response to the received command.

For example, if the hard bit data 177 is predicted to fail in decoding in the low-power decoder, but can be decoded using a high-power decoder that uses both hard bit data and soft bit data, the read manager 113 can decide to provide both the hard bit data 177 and the soft bit data 173 for decoding by the high-power decoder. For example, the high-power decoder can be implemented in the controller 115. Alternatively, the high-power decoder can be implemented in the memory device 130.

Optionally, if the hard bit data 137 is predicted to fail in decoding in decoders available in the memory sub-system 110, the read manager 113 can decide to skip transmitting the hard bit data 173 to the memory sub-system controller 115, initiate a read retry immediately, such that when the memory sub-system controller 115 requests a read retry, at least a portion of the read retry operations is performed to reduce the time for responding to the request from the memory sub-system controller 115 for a read retry. For example, during the read retry, the read manager 133 instructs the calibration circuit 145 to perform a modified calibration to obtain a new set of signal and noise characteristics 139, which can be further used to determine improved read voltages.

The data from the memory cells identified by the address (135) can include hard bit data 177 and soft bit data 173. The hard bit data 177 is retrieved using optimized read voltages. The hard bit data 177 identifies the states of the memory cells that are programmed to store data and subsequently detected in view of changes caused by factors, such as charge loss, read disturb, cross-temperature effect (e.g., write and read at different operating temperatures), etc. The soft bit data 173 is obtained by reading the memory cells using read voltages centered at each optimized read voltage with a predetermined offset from the center, optimized read voltage. The XOR of the read results at the read voltages having the offset indicates whether the memory cells provide different read results at the read voltages having the offset. The soft bit data 173 can include the XOR results. In some instances, one set of XOR results is obtained based on a smaller offset; and another set of XOR results is obtained based on a larger offset. In general, multiple sets of XOR results can be obtained for multiple offsets, where each respective offset is used to determine a lower read voltage and a higher read voltage such that both the lower and higher read voltages have the same respective offset from an optimized read voltage to determine the XOR results.

Figure 3:
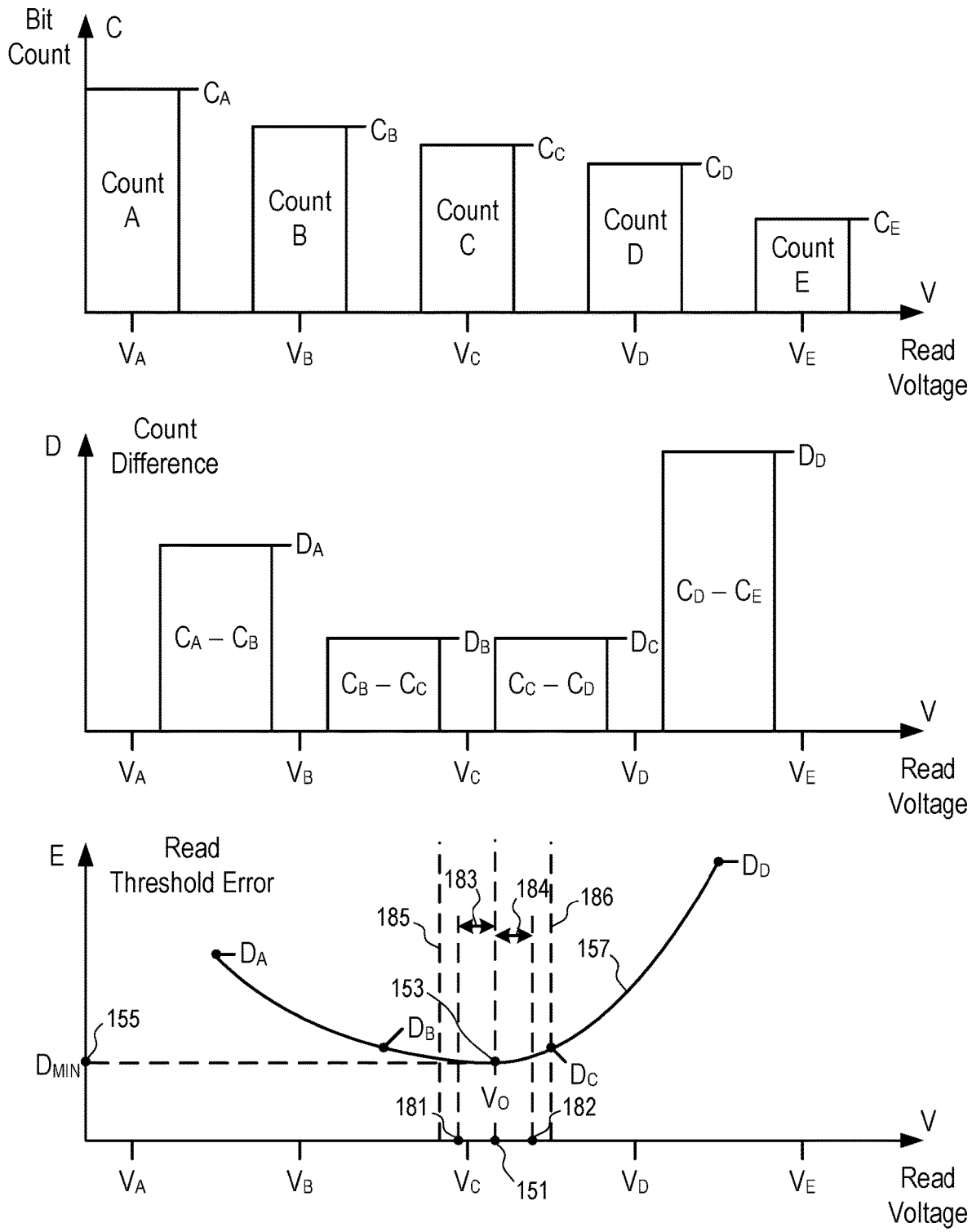
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, . . . , or 133). In general, more or less read voltages can be used to generate the signal and noise characteristics 139.

As a result of the different voltages applied during the read operation, a same memory cell in the group (e.g., 131, . . . , or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, . . . , or 133) of memory cells.

Alternatively, the group (e.g., 131, . . . , or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, . . . , or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data 137 from the address 135 that is mapped to one or more memory cells in the group (e.g., 131, . . . , or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, . . . , or 133).

For example, the count difference $D_A$ is calculated from $C_A$–$C_B$, which is an indication of read threshold error introduced by changing the read voltage from $V_A$ to $V_B$.

Similarly, $D_B$=$C_B$–$C_C$; $D_C$=$C_C$–$C_D$; and $D_D$=$C_D$–$C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data 137 from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimized read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data 137 according to the determined states.

During the read operation, the calibration circuit 145 of the memory device 130 generates the signal and noise characteristics 139. The data 137 and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxidesemiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data 137 from the memory cells at the address 135. The soft bit data in the data 137 can be obtained by reading the memory cells with read voltages that are a predetermined offset away from the optimized read voltage $V_O$. Alternatively, the memory device 130 uses the controller-specified read voltage provided in the read control parameter in reading the data 137.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 111 that receives the signal and noise characteristics 139 as part of enriched status response from the memory device 130.

The hard bit data 177 can be obtained by applying the optimized read voltage $V_O$ on the group of memory cells and determining the state of the memory cells while the memory cells are subjected to the optimized read voltages $V_O$.

The soft bit data 173 can be obtained by applying the read voltages 181 and 182 that are offset from the optimized read voltage $V_O$ with a predetermined amount. For example, the read voltage 181 is at the offset 183 of the predetermined amount lower from the optimized read voltage $V_O$; and the read voltage 182 is at the offset 184 of the same predetermined amount higher from the optimized read voltage $V_O$. A memory cell subjected to the read voltage 181 can have a state that is different from the memory cell subjected to the read voltage 182. The soft bit data 173 can include or indicate the XOR result of the data read from the memory cell using the read voltages 181 and 182. The XOR result shows whether the memory cell subjected to the read voltage 181 has the same state as being to the read voltage 182.

Figure 4:
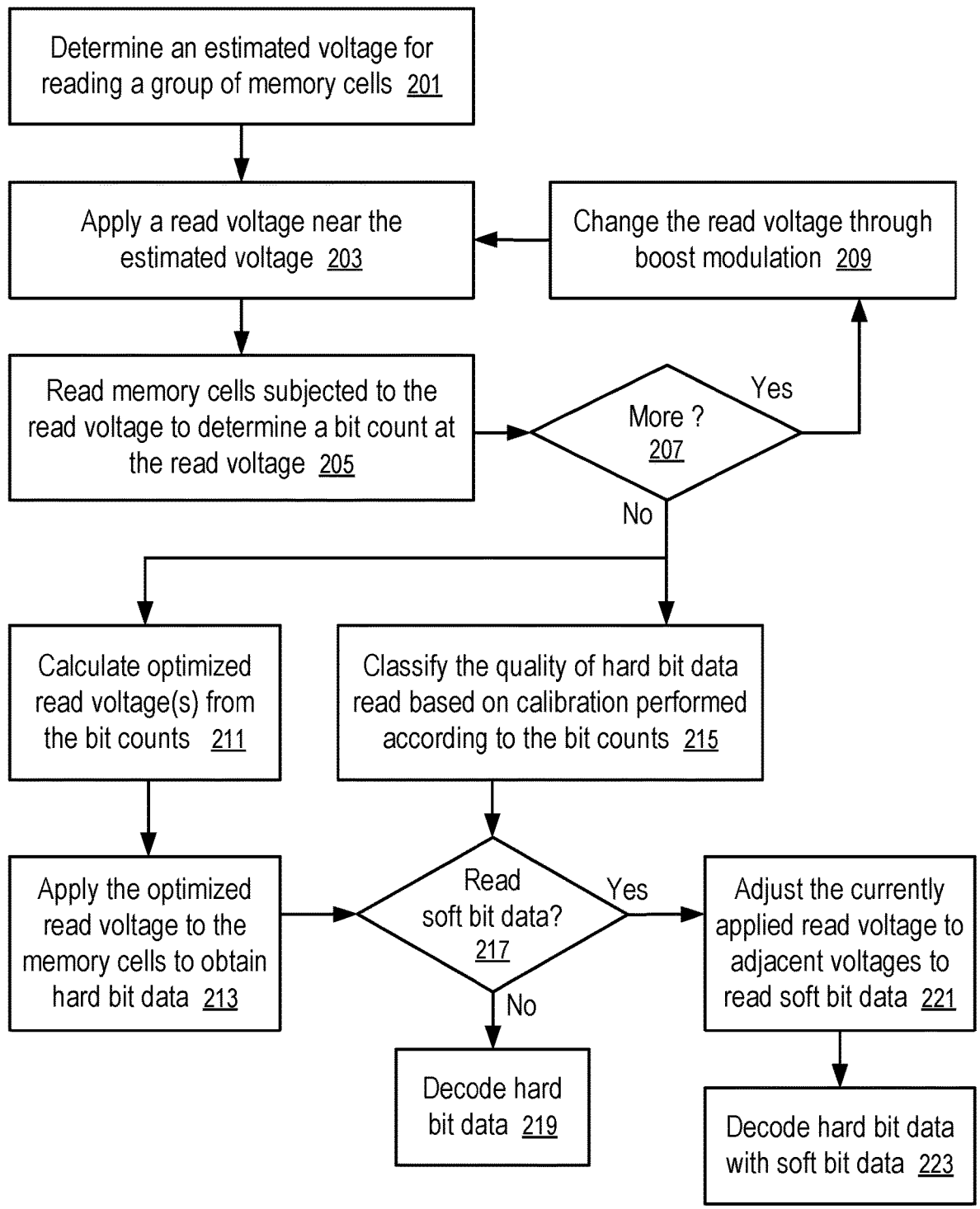
FIG. 4 illustrates reading soft bit data through boosted modulation of the read voltage applied to read hard bit data from memory cells according to one embodiment.

FIG. 4 illustrates reading soft bit data through boosted modulation of the read voltage applied to read hard bit data from memory cells according to one embodiment. For example, a read command to read soft bit data through boosted modulation of currently applied read voltage can be implemented in a memory sub-system 110 of FIG. 1 having an integrated circuit memory device 130 of FIG. 2, using the signal and noise characteristics 139 measured according to FIG. 3.

In FIG. 4, a memory device (e.g., 130 illustrated in FIG. 1 and/or FIG. 2) determines an estimated voltage for reading a group of memory cells (e.g., 131 or 133).

For example, the estimated voltage (e.g., $V_C$) can be identified and/or specified by the controller 115 of the memory sub-system 110 in connection with a read command from the controller 115.

At block 203, the memory device 130 applies a read voltage (e.g., $V_C$ or $V_A$ at or near the estimated voltage (e.g., $V_C$).

At block 205, the memory device 130 read memory cells that are subjected to the read voltage (e.g., $V_C$ or $V_A$) to determine a bit count (e.g., $C_C$ or $C_A$) at the read voltage (e.g., $V_C$ or $V_A$).

If it is determined at block 207 that more bit counts at different voltages (e.g., $V_B$ or $V_D$) are to be read for the measuring of the signal and noise characteristics 139 of the group of memory cells (e.g., 131 or 133), the memory device 130 adjusts, at block 209, the currently applied read voltage to another test voltage (e.g., $V_B$ or $V_D$) to read the bit count (e.g., $C_B$ or $C_D$) at the test voltage (e.g., $V_B$ or $V_D$).

The operations 203 to 209 can be repeated until it is determined at block 207 that no further bit count is to be read.

At block 211, the memory device 130 calculates an optimized read voltage $V_O$ from the bit counts (e.g., $C_A$, . . . , $C_E$).

Blocks 203 to 209 illustrate the sequential read of bit counts (e.g., $C_A$, . . . , $C_E$) at a plurality of test voltages (e.g., (e.g., $V_A$, . . . , $V_E$). Alternatively, multiple sub-sections of the group of memory cells (e.g., 131 or 133) can be read in parallel to generate bit counts of the sub-sections at different test voltages. The bit count of a sub-section can be used to infer the bit count of the entire group of memory cells (e.g., by scaling using a ratio between the memory cells in the sub-section and the memory cells in the entire group). Parallel reading of sub-sections for bit counts can reduce the time for measuring the bit counts. Optionally, the same number of sub-sections are configured for the test voltages such that reading each sub-section once can be sufficient to generate the bit counts (e.g., $C_A, \ldots, C_E$) for the signal and noise characteristics 139 and/or the determination of the optimized read voltage $V_O$.

As illustrated in FIG. 3, the optimized read voltage $V_O$ can be calculated at block 211 from the bit counts (e.g., $C_A, \ldots, C_E$). At block 213, the memory device 130 applies the optimized read voltage $V_O$ to the group of memory cells (e.g., 131 or 133) to obtain hard bit data that corresponds the states of the memory cells in the group (e.g., 131 or 133) under the applied voltage $V_O$.

Concurrently with the calculation 211 of the optimized read voltage $V_O$ and/or the reading 213 of the hard bit data 177, the memory device 130 classifies or predicts, at block 215, the quality of the hard bit data read based on the calibration performed according to the bit counts measured in operations 203 to 209. The classification/prediction can be performed based on the signal and noise characteristics 139 (e.g., bit counts) measured for the group of the memory cells (e.g., 131 or 133). The prediction/classification can be used to determine, at block 217, whether to read soft bit data 173.

If it is determined, at block 217, to read soft bit data 173, the memory device 130 adjusts the currently applied read voltage on the group of memory cells (e.g., 131 or 133) to adjacent voltages to read soft bit data 173. As illustrated in FIG. 3, the adjacent read voltages (e.g., 181 and 182) are determined based on offsets (e.g., 183 and 184) of the same amount from the optimized read voltage $V_O$ 151. In some implementations, multiple offset amounts are used to generate different sets of offsets to generate soft bit data 173 corresponding to the multiple amounts. For example, further adjacent read voltages (e.g., 185 and 186), centered at the optimized read voltage $V_O$ 151 with offsets larger than the offsets 183 and 184, can be used to read a second set of data for the soft bit data 173.

Subsequently, at block 223, the hard bit data 177 can be decoded with soft bit data 173. For example, the memory device 130 can transmit both the soft bit data 173 and the hard bit data 177 to the controller 115 of the memory sub-system 110 for decoding. Alternatively, the memory device 130 can include a decoder that is configured to decode 223 the hard bit data 177 with the soft bit data 173.

If it is determined, at block 217, to skip reading soft bit data 173, the hard bit data 177 can be decoded, at block 219, without soft bit data 173. For example, the memory device 130 can transmit the hard bit data 177 to the controller 115 of the memory sub-system 110 for decoding. Alternatively, the memory device 130 can include a decoder that is configured to decode 223 the hard bit data 177 without using the soft bit data 173.

FIG. 4 illustrates a configuration in which the soft bit data 173 is selectively read based on classifying 215 the quality of the hard bit data 177. Alternatively, the soft bit data 173 can be read regardless of the quality of the hard bit data 177; and the classification/prediction 215 of the quality of the hard bit data 177 can be used to determine whether to decode 219 the hard bit data 177 with the soft bit data 173, or to decode 223 the hard bit data 177 without using the soft bit data 173.

FIG. 4 illustrates a configuration in which the memory device 130 reads the memory cells at the optimized read voltage 151 and then adjusts (e.g., via boosted modulation) the read voltage to the adjacent read voltages 207 to read the soft bit data 173. In alternative configurations, the memory device 130 can read the memory cells using the calculated read voltages in a different order. For example, the memory device 130 can read the memory cells at the voltage 181, read the memory cells again via boosted modulation the applied voltage to $V_O$, and further read the memory cells via boosted modulation to the voltage 182. The results of the read operations can be organized as the hard bit data 177 and the soft bit data 173. In another sequence, the memory device 130 reads at the optimized read voltage $V_O$, then adjusts via boosted modulation to voltage 181 and to voltage 182.

For example, the hard bit data 177 retrieved from the memory cells of the memory device is in an encoded format that allows error detection and recovery using techniques such as Error Correction Code (ECC), Low-Density Parity-Check (LDPC) code. The signal and noise characteristics 139 can be provided as input to the data integrity classifier to evaluate the likelihood of the hard bit data 177 having too many errors for success decoding by some or all the processing paths/modules/options in the memory sub-system 110.

For example, the memory sub-system 110 can include a low power ECC, a full power ECC, an LDPC decoder that does not use soft bit data 173, and/or an LDPC decoder that uses both the hard bit data 177 and soft bit data 173 in decoding. In general, available paths/modules/options for decoding in a memory sub-system 110 are not limited to such the examples; different processing paths/modules/options can be implemented; and the different processing paths/modules/options have different power consumption levels, different capabilities in recovering error-free original/non-encoded data from the retrieve raw data 137, and/or different processing latency.

The data integrity classifier can be trained (e.g., through machine learning) to predict the likelihood of data integrity failure in decoding the hard bit data 177, with or without the soft bit data 173, based on the associated signal and noise characteristics 139.

For example, the likelihood of data integrity failure can be in the form of an estimated bit error rate in the hard bit data 177.

For example, the likelihood of data integrity failure can be in the form of a prediction of whether the hard bit data 177 can be successfully decoded (e.g., via ECC or LDPC) by any of the processing paths/modules/options for error detection and recovery and if so, which of the processing paths/modules/options is or are predicted to be able to successfully decode the hard bit 177 having the associated signal and noise characteristics 139, and/or whether the soft bit data 173 is to be used for a successful decoding operation.

For example, some of the processing paths/modules/options for error detection and recovery are implemented in the memory device 130; and some of the processing paths/modules/options are implemented in the controller 115. Optionally, when the classification result 165 indicates that the hard bit data 171 can be decoded using a decoder implemented in the memory device 130, the memory device 130 can optionally decode the hard bit data 171 and transmit the result of the decoder to the memory sub-system controller 115. The transmission of the hard bit data 177 can also be skipped in such a situation.

Based on the predicted likelihood of data integrity failure, the read manager 113 of the memory device 130 can determine 217 whether or not to read the soft bit data 173.

The processing logic of at least a portion of the data integrity classifier, the calibration circuit 145, and/or the read manager 113 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

A read manager 113 can include a data integrity classifier. The data integrity classifier implemented in the memory device 130 can be used in controlling the reading of the soft bit data 173 and/or the use of the soft bit data 173.

Figure 5:
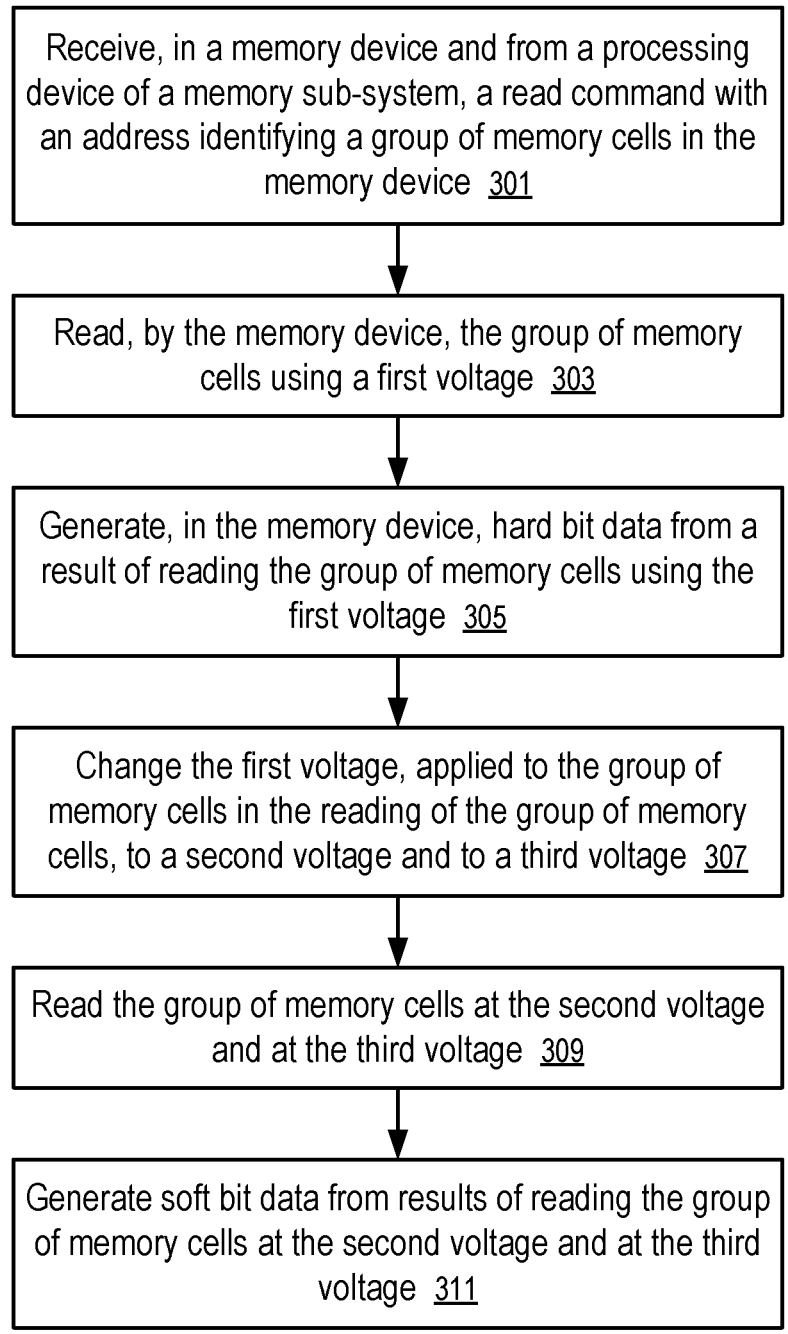
FIG. 5 shows a method to execute a read command according to one embodiment.

FIG. 5 shows a method to execute a read command according to one embodiment. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 with a memory device of FIG. 2 and signal noise characteristics illustrated in FIG. 3 with some of the operations illustrated in FIG. 4.

At block 301, a memory device 130 receives, from a processing device 117 of a memory sub-system 110, a read command with an address 135 identifying a group of memory cells (e.g., 131 or 133) in the memory device 130.

At block 303, the memory device 130 reads the group of memory cells (e.g., 131 or 133) using a first voltage (e.g., $V_O$).

At block 305, the memory device 130 generates hard bit data 177 from a result of reading 303 the group of memory cells (e.g., 131 or 133) using the first voltage (e.g., $V_O$).

At block 307, the memory device 130 changes the first voltage (e.g., $V_O$), currently being applied to the group of memory cells (e.g., 131 or 133) in the reading of the group of memory cells (e.g., 131 or 133), to a second voltage (e.g., 181 or 185) and then to a third voltage (e.g., 182 or 186).

At block 309, the memory device 130 reads the group of memory cells (e.g., 131 or 133) while the currently applied voltage is at the second voltage (e.g., 181 or 185) and at the third voltage (e.g., 182 or 186) respectively.

At block 311, the memory device 130 generates soft bit data 173 from results of reading the group of memory cells (e.g., 131 or 133) at the second voltage (e.g., 181 or 185) and at the third voltage (e.g., 182 or 186).

For example, the first voltage (e.g., $V_O$) can be changed to the second voltage (e.g., 181) and the third voltage (e.g., 182) via boosted modulation.

For example, the soft bit data 173 can be generated by performing an exclusive or (XOR) operation on a result of reading the group of memory cells (e.g., 131 or 133) at the second voltage (e.g., 181) and a result of reading the group of memory cells at the third voltage (e.g., 182). The second voltage (e.g., 181) and the third voltage (e.g., 182) are equally spaced from the first voltage (e.g., 151), as illustrated in FIG. 3.

Optionally, the first voltage (e.g., 151) is determine based on the signal and noise characteristics 139 of the group of memory cells (e.g., 131 or 133) measured in response to the read command. The signal and noise characteristics 139 can be used to further determine a classification indicative of an error rate in the hard bit data 177; and the memory device 130 can be configured to decide, based on the classification, as to whether or not to read the soft bit data 173 by adjusting to the second voltage (e.g., 181) and the third voltage (e.g., 182).

Optionally, the memory device 130 can further change the third voltage (e.g., 183), currently being applied to the group of memory cells (e.g., 131 or 133), to a fourth voltage (e.g., 185) and then to a fifth voltage (e.g., 186). Similar to the second voltage (e.g., 181) and the third voltage (e.g., 182), the fourth voltage (e.g., 185) and the fifth voltage (e.g., 186) are equally spaced from the first voltage (e.g., 151). The memory device 130 is configured to read the group of memory cells (e.g., 131 or 133) when the currently applied read voltage is at the fourth voltage (e.g., 185) and then at the fifth voltage (e.g., 186). Additional soft bit data can be generated from results of reading the group of memory cells (e.g., 131 or 133) at the fourth voltage (e.g., 185) and at the fifth voltage (e.g., 186) (e.g., through an exclusive or (XOR) operation).

A non-transitory computer storage medium can be used to store instructions of the firmware of a memory sub-system (e.g., 113). When the instructions are executed by the controller 115 and/or the processing device 117, the instructions cause the controller 115, the processing device 117, and/or a separate hardware module to perform the methods discussed above.

Figure 6:
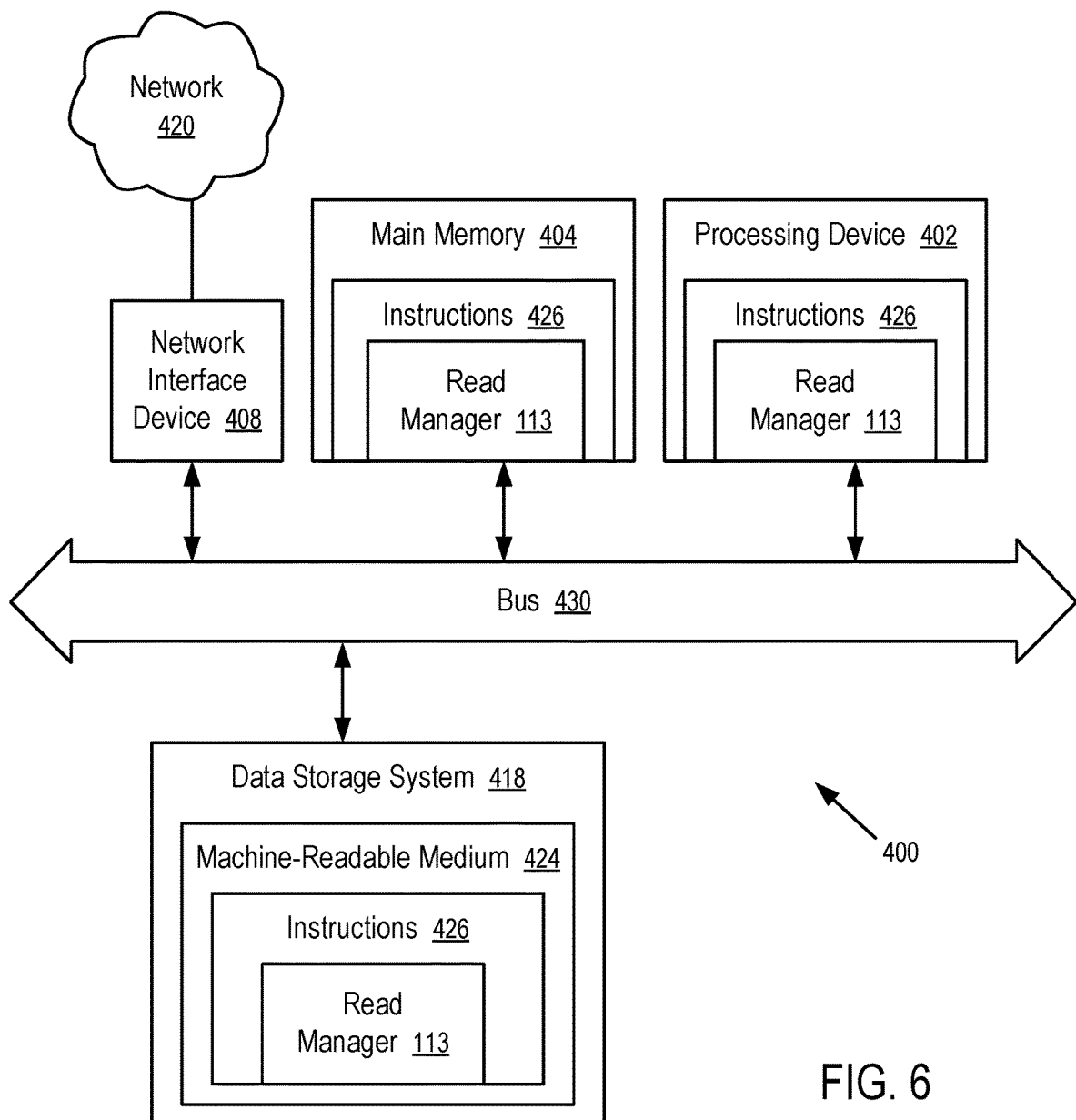
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-5). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
a processing device; and
at least one memory device, the memory device having a group of memory cells formed on an integrated circuit die;
wherein the processing device is configured to transmit, to the memory device, a read command with an address identifying the group of memory cells;
wherein in response to the read command, the memory device is configured to:
read the group of memory cells using a first voltage;
generate hard bit data from a result of reading the group of memory cells using a first voltage;
change the first voltage, applied to the group of memory cells in reading the group of memory cells for the hard bit data, to a second voltage and to a third voltage, wherein the first voltage is changed to the second voltage via boosted modulation from the first voltage; and the second voltage is changed to the third voltage via boosted modulation from the second voltage;
read the group of memory cells at the second voltage and at the third voltage; and
generate soft bit data from results of reading the group of memory cells at the second voltage and at the third voltage.

2. The memory sub-system of claim 1, wherein the second voltage is lower than the first voltage; and the third voltage is higher than the first voltage.

3. The memory sub-system of claim 1, wherein the second voltage is higher than the first voltage; and the third voltage is lower than the first voltage.

4. The memory sub-system of claim 1, wherein the soft bit data is a result of an exclusive or (XOR) operation of a result of reading the group of memory cells at the second voltage and a result of reading the group of the memory cells at the third voltage.

5. The memory sub-system of claim 4, wherein an offset of the first voltage from the second voltage is equal to an offset of the third voltage from the first voltage.

6. The memory sub-system of claim 5, wherein the memory device further comprises a calibration circuit configured to measure signal and noise characteristics of the group of memory cells in the memory device.

7. The memory sub-system of claim 6, wherein the memory device is further configured to determine the first voltage based on the signal and noise characteristics of the group of memory cells.

8. The memory sub-system of claim 7, wherein the calibration circuit is configured to measure the signal and noise characteristics of the group of memory cells in response to the read command.

9. The memory sub-system of claim 8, wherein the memory device is configured to:
determine, based on the signal and noise characteristics, a classification indicative of an error rate in the hard bit data; and
decide, based on the classification, to read the soft bit data by applying the second voltage and the third voltage.

10. The memory sub-system of claim 8, wherein the memory device is enclosed within an integrated circuit device and further configured to:
change the third voltage, applied to the group of memory cells in reading the group of memory cells for the soft bit data, to a fourth voltage and a fifth voltage, wherein the fourth voltage and the fifth voltage have offsets of a same amount from the first voltage;
read the group of memory cells at the fourth voltage and at the fifth voltage; and
generate soft bit data from results of reading the group of memory cells at the fourth voltage and at the fifth voltage.

11. A method, comprising:
receiving, in a memory device and from a processing device of a memory sub-system, a read command with an address identifying a group of memory cells in the memory device; and
in response to the read command,
reading, by the memory device, the group of memory cells using a first voltage;
generating, in the memory device, hard bit data from a result of reading the group of memory cells using the first voltage;
changing the first voltage, applied to the group of memory cells in the reading of the group of memory cells, to a second voltage and to a third voltage, wherein the first voltage is changed to the second voltage via boosted modulation from the first voltage; and the second voltage is changed to the third voltage via boosted modulation from the second voltage;
reading the group of memory cells at the second voltage and at the third voltage; and
generating soft bit data from results of reading the group of memory cells at the second voltage and at the third voltage.

12. The method of claim 11, wherein the generating the soft bit data comprises:
performing an exclusive or (XOR) operation on a result of reading the group of memory cells at the second voltage and a result of reading the group of the memory cells at the third voltage.

13. The method of claim 12, wherein the second voltage and the third voltage are equally spaced from the first voltage.

14. The method of claim 13, further comprising:
measuring signal and noise characteristics of the group of memory cells in the memory device in response to the read command; and
determining the first voltage based on the signal and noise characteristics of the group of memory cells.

15. The method of claim 14, further comprising:
determining, based on the signal and noise characteristics, a classification indicative of an error rate in the hard bit data; and
deciding, based on the classification, to read the soft bit data by applying the second voltage and the third voltage.

16. The method of claim 14, wherein the memory device is configured to:
- changing the third voltage, applied to the group of memory cells in reading the group of memory cells, to a fourth voltage and a fifth voltage, wherein the fourth voltage and the fifth voltage are equally spaced from the first voltage;
- reading the group of memory cells at the fourth voltage and at the fifth voltage; and
- generating additional soft bit data from results of reading the group of memory cells at the fourth voltage and at the fifth voltage.

17. A memory device, comprising:
- an integrated circuit package enclosing the memory device; and
- a plurality of groups of memory cells formed on at least one integrated circuit die;
- wherein in response to a read command, the memory device is configured to:
    - read a group of memory cells on the integrated circuit die using a first voltage;
    - generate hard bit data from a result of reading the group of memory cells using a first voltage;
    - change the first voltage, applied to the group of memory cells in reading the group of memory cells, to a second voltage and to a third voltage, wherein the first voltage is changed to the second voltage via boosted modulation from the first voltage; and the second voltage is changed to the third voltage via boosted modulation from the second voltage;
    - read the group of memory cells at the second voltage and at the third voltage; and
    - generate soft bit data from an exclusive or (XOR) of a result of reading the group of memory cells at the second voltage and a result of reading the group of the memory cells at the third voltage.

18. The memory device of claim 17, further configured to:
measure signal and noise characteristics of the group of memory cells in the memory device in response to the read command; and
determine the first voltage based on the signal and noise characteristics of the group of memory cells.

* * * * *